United States Patent
Olsen et al.

(10) Patent No.: US 7,569,502 B2
(45) Date of Patent: Aug. 4, 2009

(54) METHOD OF FORMING A SILICON OXYNITRIDE LAYER

(75) Inventors: Christopher Olsen, Fremont, CA (US); Faran Nouri, Los Altos, CA (US); Thai Cheng Chua, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 154 days.

(21) Appl. No.: 11/612,276

(22) Filed: Dec. 18, 2006

(65) Prior Publication Data

US 2007/0087583 A1    Apr. 19, 2007

Related U.S. Application Data

(63) Continuation of application No. 10/736,061, filed on Dec. 15, 2003, now abandoned.

(51) Int. Cl.
H01L 21/31 (2006.01)
H01L 21/469 (2006.01)
(52) U.S. Cl. .............. 438/786; 438/775; 257/E21.625
(58) Field of Classification Search .......... 438/775–786
See application file for complete search history.

(56) References Cited

U.S. PATENT DOCUMENTS

| | | | |
|---|---|---|---|
| 5,939,131 | A | 8/1999 | Kim et al. |
| 6,245,616 | B1 * | 6/2001 | Buchanan et al. ........... 438/287 |
| 6,268,267 | B1 | 7/2001 | Lin |
| 6,509,604 | B1 | 1/2003 | Pham et al. |
| 6,548,366 | B2 * | 4/2003 | Niimi et al. ................. 438/384 |
| 6,548,368 | B1 | 4/2003 | Narwankar et al. |
| 6,599,807 | B2 | 7/2003 | Lim et al. |
| 6,605,511 | B2 | 8/2003 | Pham et al. |
| 6,610,614 | B2 | 8/2003 | Niimi et al. |
| 6,649,538 | B1 * | 11/2003 | Cheng et al. ............... 438/775 |

(Continued)

FOREIGN PATENT DOCUMENTS

CN    1423832    6/2003

(Continued)

OTHER PUBLICATIONS

D. Ishikawa, et al., "Nitride-Sandwiched-Oxide Gate Insulator for Low Power CMOS," IEDM, 0-7803-7463-X.02, (2002), p. 869-872, IEEE.

(Continued)

*Primary Examiner*—Phat X Cao
*Assistant Examiner*—Nga Doan
(74) *Attorney, Agent, or Firm*—Patterson & Sheridan, LLP

(57) ABSTRACT

A $SiO_xN_y$ gate dielectric and a method for forming a $SiO_xN_y$ gate dielectric by heating a structure comprising a silicon oxide film on a silicon substrate in an atmosphere comprising $NH_3$ and then exposing the structure to a plasma comprising a nitrogen source are provided. In one aspect, the structure is annealed after it is exposed to a plasma comprising a nitrogen source. In another aspect, a $SiO_xN_y$ gate dielectric is formed in an integrated processing system by heating a structure comprising a silicon oxide film on a silicon substrate in an atmosphere comprising $NH_3$ in one chamber of the integrated processing system and then exposing the structure to a plasma comprising a nitrogen source in another chamber of the integrated processing system.

5 Claims, 6 Drawing Sheets

U.S. PATENT DOCUMENTS

| | | |
|---|---|---|
| 6,780,720 B2 | 8/2004 | Burnham et al. |
| 2001/0049186 A1* | 12/2001 | Ibok .......................... 438/591 |
| 2002/0197880 A1 | 12/2002 | Niimi et al. |
| 2002/0197882 A1 | 12/2002 | Niimi et al. |
| 2002/0197883 A1 | 12/2002 | Niimi et al. |
| 2002/0197884 A1 | 12/2002 | Niimi et al. |
| 2003/0109146 A1 | 6/2003 | Colombo et al. |
| 2003/0111678 A1 | 6/2003 | Colombo et al. |
| 2004/0053472 A1* | 3/2004 | Kiryu et al. ................. 438/287 |

FOREIGN PATENT DOCUMENTS

| | | |
|---|---|---|
| EP | 1 326 271 A1 | 7/2003 |
| JP | 6-140392 | 5/1994 |
| WO | 02/23614 | 3/2002 |

OTHER PUBLICATIONS

PCT Preliminary Report on Patentability for PCT/US2004/037346, Dated Jun. 29, 2006.

PCT International Search Report and Written Opinion for PCT/US2004/037346, Dated Jun. 29, 2005.

First Office Action corresponding to Chinese Patent Application No. 200480037295.4, Jan. 18, 2008. Provided as a concise explanation of relevance for B1 reference.

* cited by examiner

METHOD OF FORMING A SILICON OXYNITRIDE LAYER

CROSS-REFERENCE TO RELATED APPLICATIONS

This application is a continuation of U.S. patent application Ser. No. 10/736,061, filed Dec. 15, 2003 now abandoned.

BACKGROUND OF THE INVENTION

1. Field of the Invention

Embodiments of the present invention generally relate to a method of forming a gate dielectric. More particularly, embodiments of the invention relate to a method of forming a silicon oxynitride ($SiO_xN_y$) gate dielectric.

2. Description of the Related Art

Integrated circuits are composed of many, e.g., millions, of devices such as transistors, capacitors, and resistors. Transistors, such as field effect transistors, typically include a source, a drain, and a gate stack. The gate stack typically includes a substrate, such as a silicon substrate, a gate dielectric, such as silicon dioxide, $SiO_2$, on the substrate, and a gate electrode, such as polycrystalline silicon, on the gate dielectric.

As integrated circuit sizes and the sizes of the transistors thereon decrease, the gate drive current required to increase the speed of the transistor has increased. Because the drive current increases as the gate capacitance increases, and capacitance is inversely proportional to the gate dielectric thickness, decreasing the dielectric thickness is one method of increasing the drive current.

Attempts have been made to reduce the thickness of $SiO_2$ gate dielectrics below 20 Å. However, it has been found that the use of thin $SiO_2$ gate dielectrics below 20 Å often results in undesirable effects on gate performance and durability. For example, boron from a boron doped gate electrode can penetrate through a thin $SiO_2$ gate dielectric into the underlying silicon substrate. Also, there is typically an increase in gate leakage, i.e., tunneling, with thin dielectrics that increases the amount of power consumed by the gate. Thin $SiO_2$ gate dielectrics may be susceptible to hot carrier damage, in which high energy carriers traveling across the dielectric can damage or destroy the gate. Thin $SiO_2$ gate dielectrics may also be susceptible to negative bias temperature instability (NBTI), wherein the threshold voltage or drive current drifts with operation of the gate.

One method that has been used to address the problems with thin $SiO_2$ gate dielectrics is to incorporate nitrogen into the $SiO_2$ layer to form a $SiO_xN_y$ gate dielectric. Incorporating nitrogen into the $SiO_2$ layer blocks boron penetration into the underlying silicon substrate and raises the dielectric constant of the gate dielectric, allowing the use of a thicker dielectric layer.

Heating a silicon oxide layer in the presence of ammonia ($NH_3$) has been used to convert a $SiO_2$ layer to a $SiO_xN_y$ layer. However, the conventional methods of heating a silicon oxide layer in the presence of $NH_3$ in a furnace have typically resulted in non-uniform incorporation of nitrogen across the $SiO_2$ layer in different parts of the furnace due to air flow when the furnace is opened or closed. Additionally, oxygen or water vapor contamination of the $SiO_2$ layer may block incorporation of nitrogen into the $SiO_2$ layer.

Plasma nitriding (DPN) has also been used to convert a $SiO_2$ layer to a $SiO_xN_y$ layer. Gate stacks with a high PMOS drive current and a low gate leakage have been formed using plasma nitriding. However, attempts to form gate stacks with a high N-channel metal-oxide semiconductor (NMOS) drive current and a low gate leakage using plasma nitriding have been unsuccessful at less than 12 Å EOT (equivalent oxide thickness). For example, FIG. 1 shows that heating a silicon oxide layer in the presence of $NH_3$ results in a higher NMOS drive current at a normalized voltage of the threshold voltage +0.75 V (Idsat(Vt+0.75V)) relative to NMOS gate leakage at a normalized voltage of the threshold voltage +1 V (Jg(Vt+1)) than plasma nitriding the silicon oxide layer. Additionally, FIG. 2 shows that plasma nitriding a silicon oxide layer results in a higher P-channel metal-oxide semiconductor (PMOS) drive current at a normalized voltage of the threshold voltage +0.75 V (Idsat(Vt+0.75V)) relative to NMOS gate leakage at a normalized voltage of the threshold voltage +1 V (Jg(Vt+1)) than heating the silicon oxide layer in the presence of $NH_3$.

CMOS circuits typically contain both NMOS and PMOS devices. Thus, there remains a need for a method of depositing a $SiO_xN_y$ gate dielectric that has a high drive current and low leakage current for both PMOS and NMOS devices.

SUMMARY OF THE INVENTION

Embodiments of the present invention generally provide a method of forming a $SiO_xN_y$ gate dielectric, comprising heating a structure comprising a silicon oxide film on a silicon substrate in an atmosphere comprising $NH_3$ to incorporate nitrogen into the silicon oxide film, and then exposing the structure to a plasma comprising a nitrogen source to form a $SiO_xN_y$ gate dielectric on the substrate. In one embodiment, the structure is annealed after the structure is exposed to a plasma comprising a nitrogen source.

Embodiments of the invention also provide a method of forming a $SiO_xN_y$ gate dielectric in an integrated processing system, comprising heating a structure comprising a silicon oxide film on a silicon substrate in an atmosphere comprising $NH_3$ in a first processing chamber of the integrated processing system to incorporate nitrogen into the silicon oxide film, transferring the structure to a second processing chamber of the integrated processing system, and then exposing the structure to a plasma comprising a nitrogen source in the second processing chamber to form a $SiO_xN_y$ gate dielectric on the substrate. In one embodiment, the silicon oxide film is formed on the substrate in the integrated processing system, and the structure is not removed from the integrated processing system until after the $SiO_xN_y$ gate dielectric is formed.

In another embodiment, a $SiO_xN_y$ gate dielectric, formed by a method comprising heating a structure comprising a silicon oxide film on a silicon substrate in an atmosphere comprising $NH_3$ to incorporate nitrogen into the silicon oxide film, and then exposing the structure to a plasma comprising a nitrogen source to form a $SiO_xN_y$ gate dielectric on the substrate, is provided.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
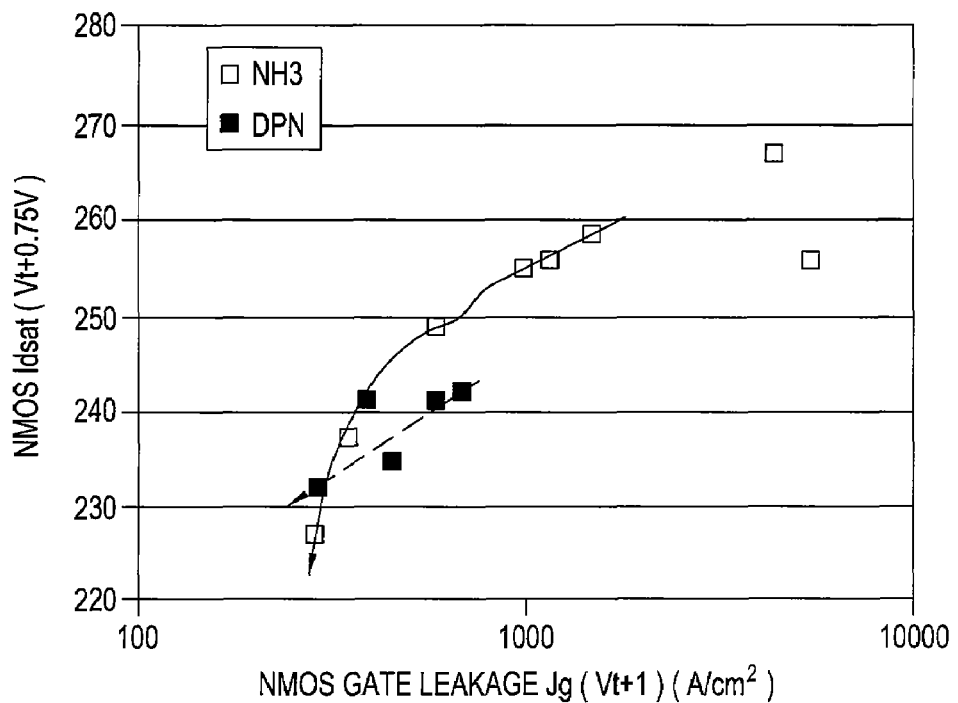
FIG. 1 is a graph showing NMOS drive current relative to NMOS gate leakage for gate stacks comprising $SiO_xN_y$ gate dielectrics.
Figure 2:
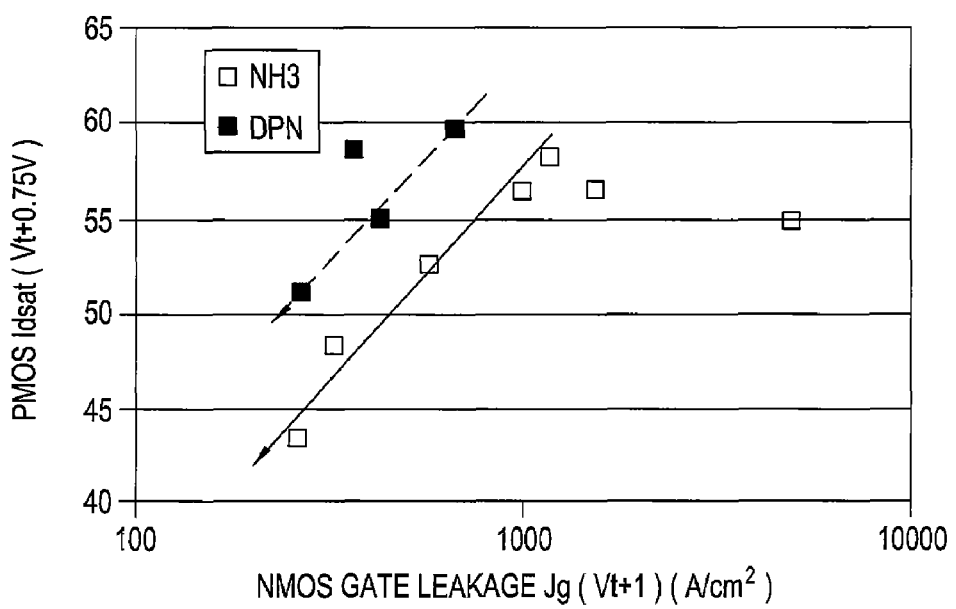
FIG. 2 is a graph showing PMOS drive current relative to NMOS gate leakage for gate stacks comprising $SiO_xN_y$ gate dielectrics.

Embodiments of the invention include a method for depositing a $SiO_xN_y$ gate dielectric. Gate stacks including the $SiO_xN_y$ gate dielectric exhibit desirable electrical properties in both NMOS and PMOS devices.

In one embodiment, a $SiO_xN_y$ gate dielectric is formed by heating a structure comprising a silicon oxide film on a silicon substrate in an atmosphere comprising $NH_3$. As defined herein, a silicon substrate includes single layer silicon substrates, such as silicon wafers, or structures that include a silicon layer on one or more other layers. The silicon oxide film on the silicon substrate may be formed by exposing the silicon substrate to an atmosphere comprising oxygen to oxidize the top surface of the substrate. The atmosphere comprising oxygen may be an ambient of oxygen ($O_2$), hydrogen ($H_2$) and $O_2$, $H_2$ and nitrous oxide ($N_2O$), $O_2$ and an inert gas, or combinations thereof. The silicon oxide film may have a thickness of about 4 Å to about 16 Å, for example. In one embodiment, the silicon substrate may be exposed to an atmosphere comprising oxygen at a substrate temperature between about 700° C. and about 1100° C. and at a pressure between about 0.1 Torr and about 800 Torr for a time of between about 1 second and about 120 seconds. Preferably, the temperature is between about 750° C. and about 1000° C., and the pressure is between about 0.5 Torr and about 50 Torr.

Heating the structure comprising a silicon oxide film in an atmosphere comprising $NH_3$ incorporates nitrogen into the silicon oxide film such that the top surface of the silicon oxide film is nitrogen-doped. The structure may be heated to a temperature of at least about 700° C. at a pressure of less than about 100 Torr, such as a pressure between about 0.1 Torr and about 100 Torr. Preferably, the structure is heated to a temperature between about 700° C. and about 1100° C., such as about 1050° C., at an $NH_3$ partial pressure of about 1 Torr. The structure may be heated for a time of between about 1 second and about 120 seconds or for a period of time sufficient to nitrogen dope the top surface of the silicon oxide film. Preferably, substantially no oxygen is incorporated into the structure while heating the structure in an atmosphere comprising $NH_3$.

After the structure is heated in an atmosphere comprising $NH_3$, the structure is exposed to a plasma comprising a nitrogen source to incorporate more nitrogen into the silicon oxide film, thereby forming the $SiO_xN_y$ gate dielectric. The nitrogen source may be nitrogen ($N_2$), $NH_3$, or combinations thereof. The plasma may further comprise an inert gas, such as helium, argon, or combinations thereof. The pressure during the plasma exposure of the substrate may be between about 1 mTorr and about 30 mTorr, such as between about 1 mTorr and about 10 mTorr.

Preferably, the $SiO_xN_y$ gate dielectric described herein comprises at least 5 atomic percent nitrogen. In one embodiment, the $SiO_xN_y$ gate dielectric comprises between about 5 atomic percent nitrogen and about 15 atomic percent nitrogen.

Optionally, the structure is annealed after exposure to the plasma. In one embodiment, the structure is annealed in an atmosphere comprising $O_2$. The partial pressure of $O_2$ during the anneal may be less than 50 Torr, such as between about 10 mTorr and about 50 Torr. The structure may be annealed at a temperature of between about 700° C. and about 1100° C., such as at a temperature between about 950° C. and about 1100° C. In another embodiment, the structure is annealed in an inert or reducing atmosphere and then annealed in an atmosphere comprising $O_2$ as described above. The structure may be annealed in the inert or reducing atmosphere at a temperature of between about 700° C. and about 1100° C., such as at a temperature between about 950° C. and about 1100° C. For example, the structure may be annealed at a temperature of about 1000° C. in an atmosphere comprising $N_2$ at an $N_2$ partial pressure of between about 1 Torr and about 760 Torr.

After the structure is exposed to the plasma and optionally annealed, a gate electrode, such as a polysilicon layer, may be deposited on the $SiO_xN_y$ gate dielectric to complete a gate stack.

Integrated Processing Sequence

Figure 3:
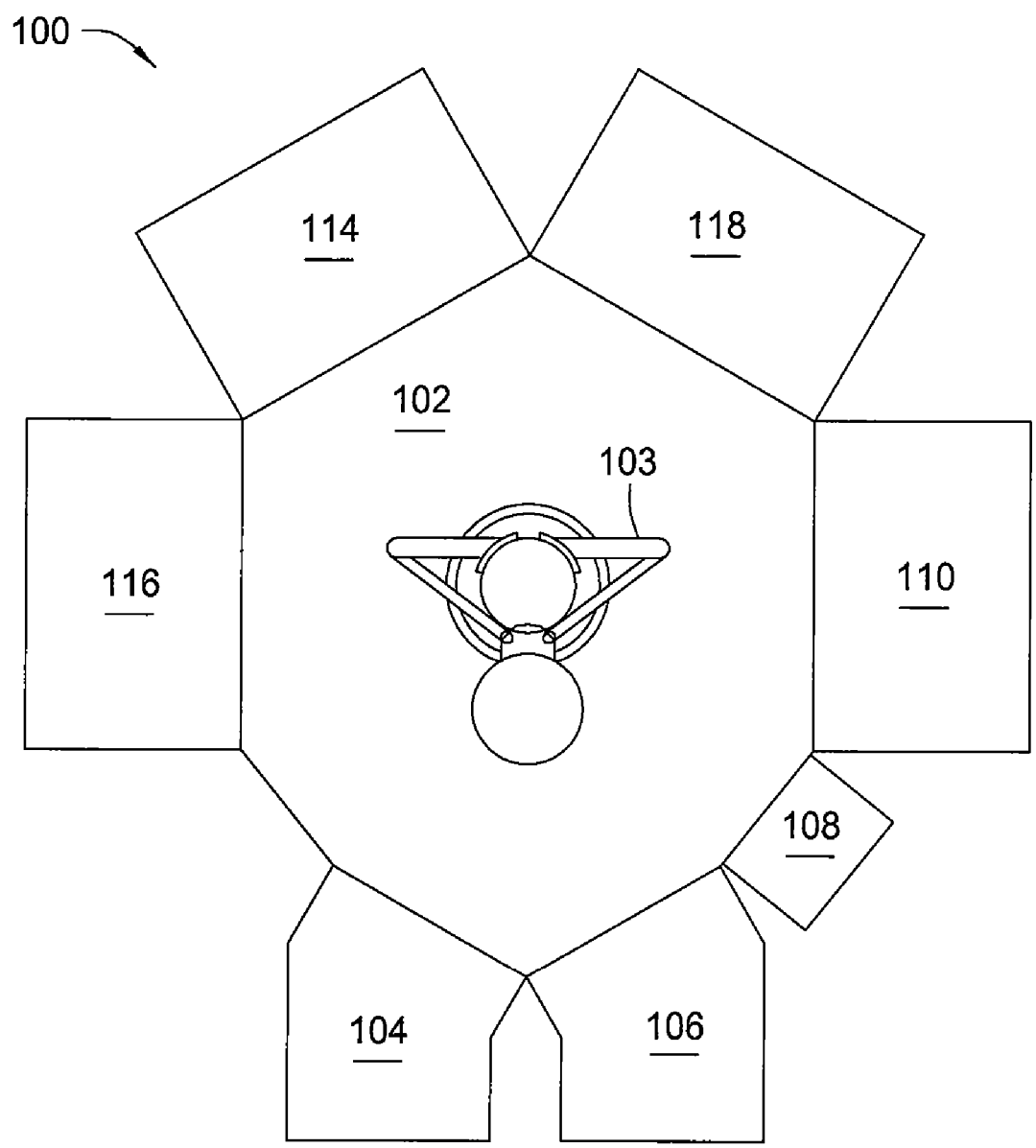
FIG. 3 is a top schematic view of an integrated processing system.

In a further embodiment, a $SiO_xN_y$ gate dielectric may be formed on a substrate in an integrated processing system, such as an integrated semiconductor processing system, in a method in which the substrate is not removed from the integrated processing system until after the $SiO_xN_y$ gate dielectric is formed. An example of an integrated processing system 100 that may be used is the Gate Stack Centura® system, available from Applied Materials, Inc. of Santa Clara, Calif., which is shown in FIG. 3. The integrated processing system 100 may include a central transfer chamber 102, transfer robot 103, load locks 104, 106, a cool down chamber 108, a thermal processing chamber 110, a plasma processing chamber 114, a rapid thermal processing (RTP) chamber 116, and a CVD processing chamber 118. CVD processing chamber 118 may be a low pressure chemical vapor deposition chamber (LPCVD), such as a POLYgen chamber, available from Applied Materials.

The processing conditions for embodiments in which the $SiO_xN_y$ gate dielectric is formed in an integrated processing system may be the same as the processing conditions described above for the formation of the silicon oxide film and the $SiO_xN_y$ gate dielectric. For example, in one embodiment a structure comprising a silicon dioxide film on a silicon substrate may be heated in an atmosphere comprising $NH_3$ in a first processing chamber of the integrated processing system to incorporate nitrogen into the silicon oxide film. Because the substrate is exposed to an atmosphere comprising $NH_3$ within an enclosed integrated processing system, contaminating oxygen is typically not incorporated into the structure during the heating in an atmosphere comprising $NH_3$. The structure may then be transferred to a second processing chamber of the integrated processing system and exposed to a plasma comprising a nitrogen source in the second processing chamber. Optionally, after exposing the structure to the plasma, the structure may be transferred to a third processing chamber of the integrated processing system and annealed in the third processing chamber.

In another embodiment, a substrate is introduced into an integrated processing system and a silicon oxide film, a $SiO_xN_y$ gate dielectric, and a gate electrode are deposited on the substrate without removing the substrate from the integrated processing system. This embodiment will be described below with respect to FIGS. 3 and 4.

Figure 4:
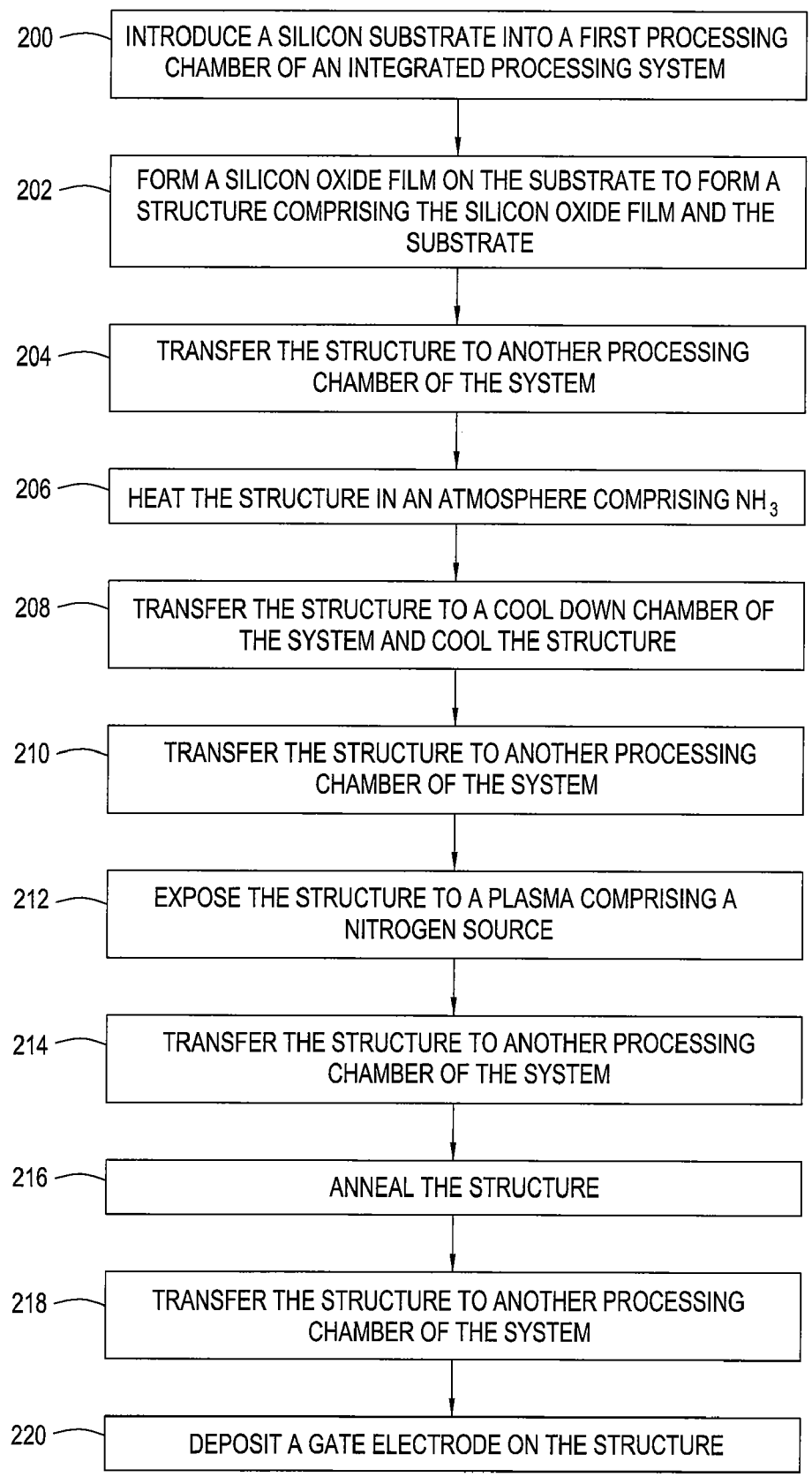
FIG. 4 is a flow chart depicting an embodiment of the invention.

A silicon substrate may be introduced into the integrated processing system 100 via a load lock 102 or 104 and placed in RTP chamber 116, where a silicon oxide film may be formed on the silicon substrate, as shown in steps 200 and 202 of FIG. 4. The structure, including the substrate and the silicon oxide film, may then be transferred to thermal processing chamber 110, where it is heated in an atmosphere comprising $NH_3$ to incorporate nitrogen into the silicon oxide film, as shown in steps 204 and 206. The structure may then be transferred to cool down chamber 108 and cooled, for example, to less than about 100° C. in about 1 to about 2 minutes, as shown in step 208. The structure may then be transferred to plasma processing chamber 114, where it is exposed to a plasma comprising a nitrogen source to incorporate more nitrogen into the silicon oxide film and form the $SiO_xN_y$ gate dielectric, as shown in steps 210 and 212. Optionally, the structure may be transferred to RTP chamber 116 where the structure may be annealed, as shown in steps 214 and 216. The structure may then be transferred to CVD processing chamber 118, as shown in step 218, and a gate electrode, such as a polysilicon layer or an amorphous silicon layer may be deposited on the structure, as shown in step 220. The structure may then be removed from the integrated processing system 100 via a load lock 102 or 104.

Figure 5:
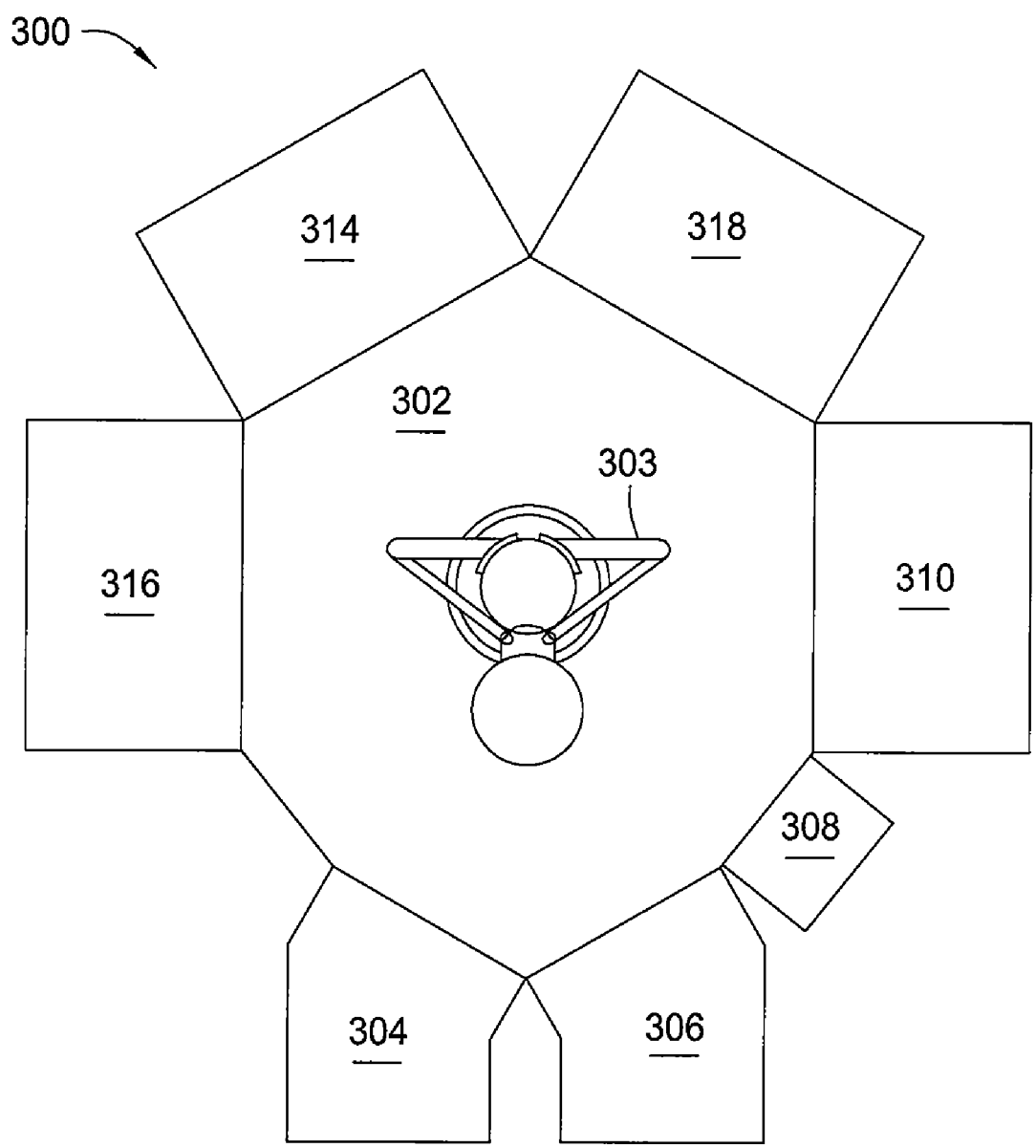
FIG. 5 is a top schematic view of an integrated processing system.

In the embodiment described above with respect to FIGS. 3 and 4, the silicon oxide film is formed on the substrate in RTP chamber 116 in one step and the structure is annealed in the same RTP chamber 116 in another step. In an alternative embodiment, a second RTP chamber is configured on an integrated processing system 300, as shown in FIG. 5, and the silicon oxide film is formed in one RTP chamber in one step and the structure is annealed in a different RTP chamber in another step. The integrated processing system 300 may include a central transfer chamber 302, transfer robot 303, load locks 304, 306, a cool down chamber 308, a thermal processing chamber 310, a plasma processing chamber 314, a rapid thermal processing (RTP) chamber 316, and a RTP chamber 318.

A silicon substrate may be introduced into the integrated processing system 300 via a load lock 302 or 304 and placed in RTP chamber 316, where a silicon oxide film may be formed on the silicon substrate. The structure, including the substrate and the silicon oxide film, may then be transferred to thermal processing chamber 310, where it is heated in an atmosphere comprising $NH_3$ to incorporate nitrogen into the silicon oxide film. The structure may then be transferred to cool down chamber 308 and cooled, for example, to less than about 100° C. in about 1 to about 2 minutes. The structure may then be transferred to plasma processing chamber 314, where it is exposed to a plasma comprising a nitrogen source to incorporate more nitrogen into the silicon oxide film and form the $SiO_xN_y$ gate dielectric. Optionally, the structure may then be transferred to RTP chamber 318 where the structure may be annealed. After the structure is annealed, the structure may be transferred out of the integrated processing system 300 via load lock 302 or 304 to a processing chamber (not shown) external to the integrated processing system such as a low pressure chemical vapor deposition chamber (LPCVD), for depositing a gate electrode, such as a polysilicon layer or an amorphous silicon layer.

While the above embodiments are described with respect to FIGS. 3 and 5, it is recognized that other integrated processing systems may be used with the embodiments described herein.

Performance of $SiO_xN_y$ Gate Dielectrics in NMOS and PMOS Devices

Figure 6:
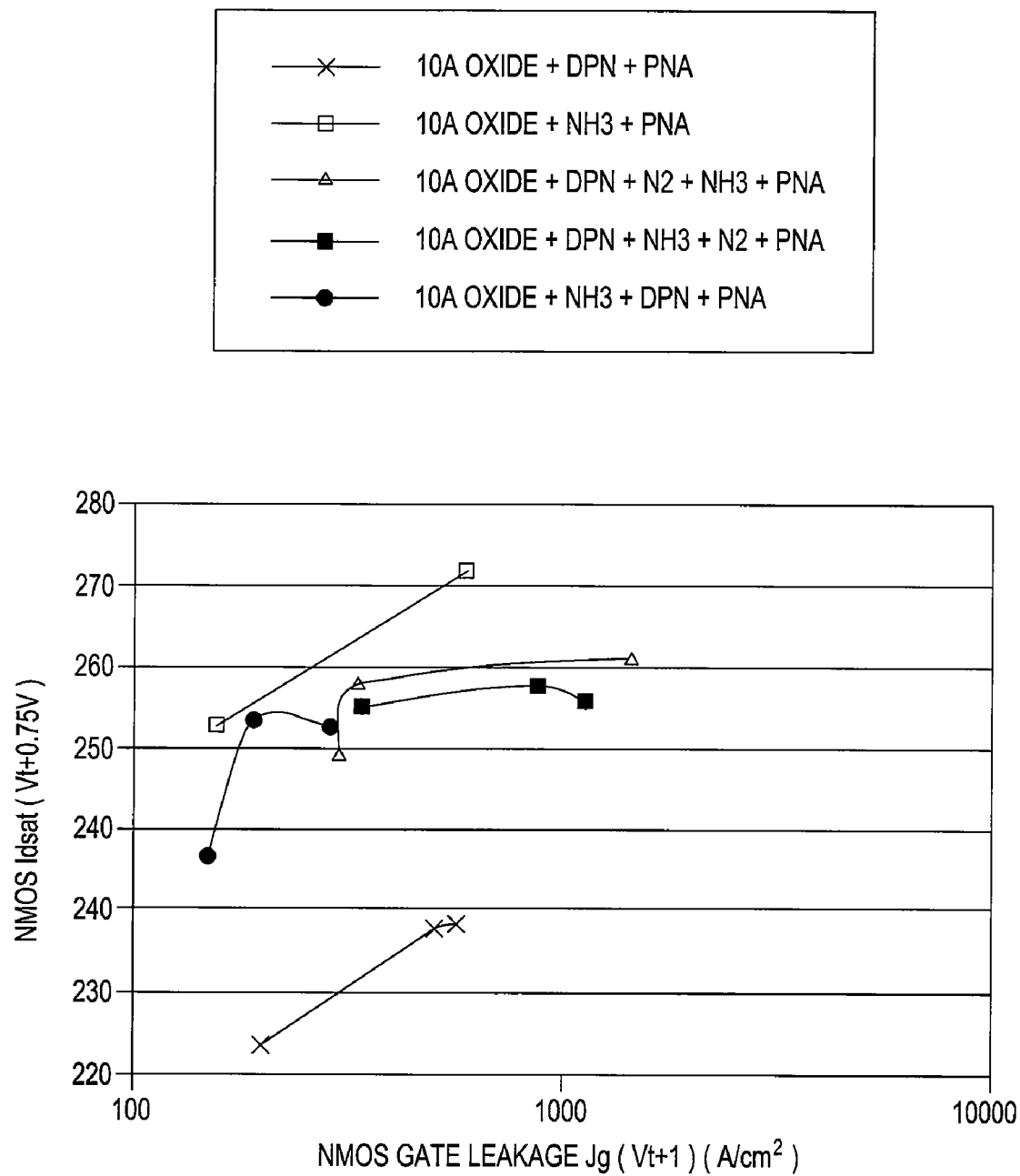
FIG. 6 is a graph showing NMOS drive current relative to NMOS gate leakage for gate stacks comprising $SiO_xN_y$ gate dielectrics.
Figure 7:
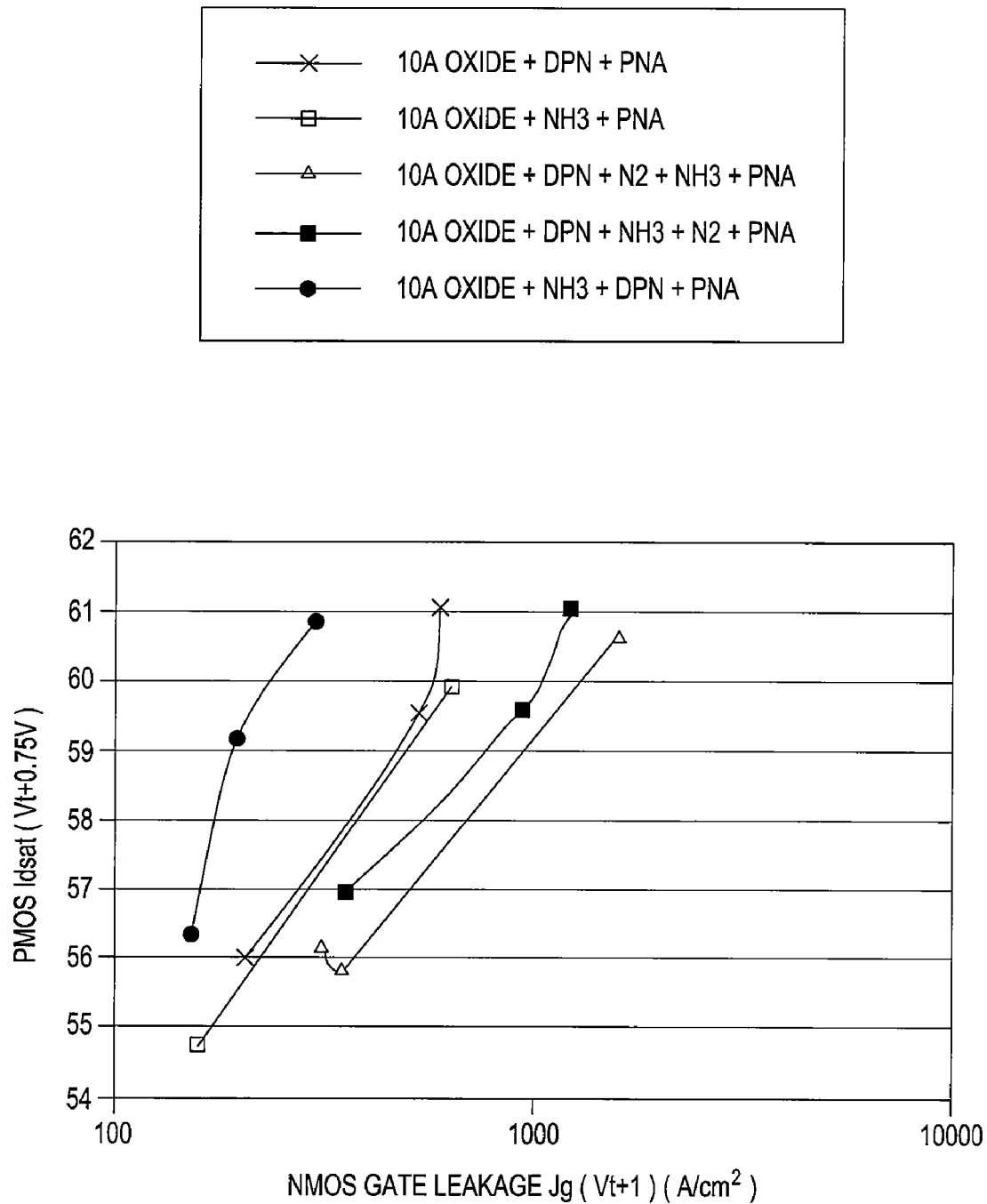
FIG. 7 is a graph showing PMOS drive current relative to NMOS gate leakage for gate stacks comprising $SiO_xN_y$ gate dielectrics.

FIGS. 6 and 7 respectively show the NMOS drive current versus NMOS gate leakage and PMOS drive current versus NMOS gate leakage for gate stacks including a structure comprising a $SiO_xN_y$ gate dielectric formed according to embodiments of the invention as well as for gate stacks formed according to other methods. The following process sequences were compared in FIGS. 6 and 7: a silicon substrate was oxidized to form a 10 Å silicon oxide layer on the substrate (10 Å oxide), plasma treated in nitrogen atmosphere (decoupled plasma nitridation, DPN), and then annealed (post nitridation anneal, PNA); 10 Å oxide, heated in an atmosphere comprising $NH_3$ ($NH_3$), and then PNA; 10 Å oxide, DPN, heated in an atmosphere comprising $N_2$ ($N_2$) and then $NH_3$, and then PNA; 10 Å oxide, DPN, heated in an atmosphere comprising $NH_3$, heated in an atmosphere comprising $N_2$, and then PNA; and 10 Å oxide, $NH_3$, DPN, and then PNA, according to an embodiment of the invention. The PNA was performed at 1000° C. for 15 seconds in atmosphere with an $O_2$ partial pressure of 60 mTorr.

FIG. 6 illustrates that while a process sequence in which a structure is heated in an atmosphere comprising $NH_3$ and then annealed provides low NMOS gate leakage at a high NMOS drive current, a process sequence in which a structure is heated in an atmosphere comprising $NH_3$, treated with a plasma comprising nitrogen, and then annealed, as described in embodiments of the invention, also provides desirable NMOS performance.

FIG. 7 illustrates that a process in which a structure is heated in an atmosphere comprising $NH_3$, treated with a plasma comprising nitrogen, and then annealed, as described in embodiments of the invention, provides less NMOS gate leakage at a higher PMOS drive current than the other processes tested.

Thus, a process in which a structure is heated in an atmosphere comprising $NH_3$, treated with a plasma comprising nitrogen, and then annealed, as described in embodiments of the invention, can provide gate stacks that have desirable low gate leakage relative to both NMOS drive currents and PMOS drive currents. Furthermore, a process in which a structure is treated with a plasma comprising nitrogen, heated in an atmosphere comprising $NH_3$, and then annealed provides structures that have significantly higher NMOS gate leakages for comparable NMOS and PMOS drive currents.

It is believed that heating the structure in an atmosphere comprising $NH_3$ prior to treating the structure with a plasma comprising nitrogen smoothens the interface between the gate dielectric and the underlying silicon substrate, resulting in enhanced device performance and reliability. It is also believed that the formation of a slightly thicker oxide film by heating the structure first in an atmosphere comprising $NH_3$ prior to plasma treating the structure enhances the performance characteristics of a PMOS device.

While the foregoing is directed to embodiments of the present invention, other and further embodiments of the invention may be devised without departing from the basic scope thereof, and the scope thereof is determined by the claims that follow.

What is claimed is:

1. A method of forming a gate dielectric in an integrated processing system, comprising:

doping the silicon oxide film with nitrogen formed on a silicon substrate by heating a structure comprising the silicon oxide film in an atmosphere comprising $NH_3$ to a temperature between about 700° C. and about 1100° C. in a first processing chamber of the integrated processing system, wherein substantially no oxygen is incorporated into the structure while heating the structure in an atmosphere comprising $NH_3$;

transferring the structure to a second processing chamber of the integrated processing system;

cooling the doped structure to less than about 100 degrees Celsius;

transferring the chamber to a third processing chamber; and exposing the structure to a plasma comprising a nitrogen source in the third processing chamber, wherein exposing the structure to the plasma comprising a nitrogen source incorporates more nitrogen into the silicon oxide film and forms a silicon oxynitride gate dielectric on the substrate.

2. The method of claim 1, further comprising:

transferring the structure to a fourth processing chamber of the integrated processing system; and annealing the substrate in the fourth processing chamber.

3. The method of claim 2, further comprising:

transferring the structure to a fifth processing chamber of the integrated processing system after the annealing the substrate; and depositing a polysilicon layer on the silicon oxynitride gate dielectric in the fifth processing chamber.

4. The method of claim 2, wherein the annealing is performed in an atmosphere comprising $O_2$.

5. The method of claim 4, wherein the annealing further comprises annealing the structure in an inert or reducing atmosphere before the annealing in an atmosphere comprising $O_2$.

* * * * *